(12) United States Patent
Hunt

(10) Patent No.: US 8,405,460 B2
(45) Date of Patent: Mar. 26, 2013

(54) CIRCUITRY FOR BIASING AMPLIFIERS

(75) Inventor: Ken Hunt, Finchampstead (GB)

(73) Assignee: Aptina Imaging Corporation, George Town (KY)

( * ) Notice: Subject to any disclaimer, the term of this patent is extended or adjusted under 35 U.S.C. 154(b) by 34 days.

(21) Appl. No.: 13/044,968

(22) Filed: Mar. 10, 2011

(65) Prior Publication Data

US 2012/0188016 A1     Jul. 26, 2012

Related U.S. Application Data

(60) Provisional application No. 61/435,645, filed on Jan. 24, 2011.

(51) Int. Cl.
 *H03F 3/26* (2006.01)
(52) U.S. Cl. ........................ 330/269; 330/267
(58) Field of Classification Search .......... 330/262–276, 330/255
See application file for complete search history.

(56) References Cited

U.S. PATENT DOCUMENTS

| | | | |
|---|---|---|---|
| 4,037,166 A | 7/1977 | Yokoyama | |
| 4,274,059 A | 6/1981 | Okabe | |
| 4,335,360 A | 6/1982 | Hoover | |
| 4,370,623 A | 1/1983 | Nagasawa | |
| 4,991,916 A | 2/1991 | Deaver | |
| 6,646,508 B1 * | 11/2003 | Barbetta | 330/264 |

* cited by examiner

*Primary Examiner* — Hieu Nguyen
(74) *Attorney, Agent, or Firm* — Treyz Law Group; Chih-Yun Wu

(57) ABSTRACT

Integrated circuits with amplification circuitry are provided. The amplification circuitry may have an input terminal, an output terminal, a positive power supply terminal, and a ground terminal. The amplification circuitry may include first, second, and third stages. The first stage may provide biasing for the second stage. The second stage may provide biasing for the third stage. The second stage may provide paths for conveying an input signal from the input terminal to the third stage. The second stage may bias the amplifier to have low quiescent current and low shoot-through current. The second stage may prevent PVT variations such as supply voltage variations from affecting the quiescent current and shoot-through current of the amplifier. To increase the high-frequency response of the amplifier, capacitors may be added to the paths for conveying the input signal from the input terminal to the third stage.

6 Claims, 4 Drawing Sheets

US 8,405,460 B2

CIRCUITRY FOR BIASING AMPLIFIERS

This application claims the benefit of provisional patent application No. 61/435,645, filed Jan. 24, 2011, which is hereby incorporated by reference herein in its entirety.

BACKGROUND

This relates generally to bias circuitry and, more particularly, to bias circuitry for amplifiers.

Integrated circuits such as image sensors may contain amplification circuitry such as high-speed drivers. In high-speed drivers, at least one amplification stage is used to drive a signal on an output line. Push-pull amplifiers may be used as one of the amplification stages (e.g. class B push-pull amplifiers or class AB push-pull amplifiers).

In conventional push-pull amplifiers, a first output transistor is used to sink current from an output load to a ground power supply terminal, while a second output transistor is used to supply current to the output load from a positive power supply terminal. Typically, when an input voltage signal is applied to the input terminal of a conventional push-pull amplifier, the output terminal may either be dissipated of current by the first output transistor or supplied current by the second output transistor. Ideally, the first output transistor is never sinking current when the second output transistor is supplying current. However, this operating behavior may require that the transistors be biased below or at their threshold voltages (e.g., the transistors are biased such that, at zero input voltage, both transistors are off). Due to integrated circuit delay and the exponential current characteristics of transistor behavior at bias voltages near the transistor threshold voltage, the transition between the first output transistor sinking current and the second output transistor supplying current may not be synchronized (e.g., when the first output transistor stops sinking current, the second output transistor may not immediately begin supplying current). The effect on the push-pull amplifier output due to lack of synchronization between the two output transistors may be referred to as crossover distortion.

To counteract the effects of crossover distortion, the output transistors of push-pull class B amplifiers may be biased at voltages above the transistor threshold voltage. Such a configuration may be referred to as a push-pull class AB amplifier. In a class AB amplifier, the current through both of the output transistors may be non-zero when no input voltage signal is applied to the amplifier (e.g., at the given bias voltages, the first output transistor may be sinking current while the second output transistor is supplying current). The current through the first output transistor and the second output transistor while no input voltage is applied to the amplifier may be referred to as quiescent current.

Integrated circuits may experience undesirable effects during manufacturing and normal usage. These effects may include process, voltage, and temperature variations (so-called PVT variations). PVT variations may further cause variations in supply voltage, bias voltages, resistor values, transistor threshold voltages, and other factors affecting the amplifier quiescent current. The amplifier quiescent current may increase as a result of PVT variations (e.g., if the supply voltage increases, the quiescent current through the output transistors will increase). An increase in quiescent current may result in unacceptable circuit power consumption.

In an arrangement where push-pull amplifiers are used to drive an output signal, direct current may be generated from the supply voltage terminal to the ground terminal when an input signal to a class AB amplifier transitions between a high and a low voltage. During this transition, the first output transistor and second output transistor may both be activated for a period of time (e.g., when the input signal voltage level transitions near the bias voltage level, the first output transistor may be sinking current while the second output transistor is supplying current). The current generated between the positive power supply line and power supply ground may be referred to as shoot-through current. Conventional push-pull amplifiers may have high shoot-through currents that result in unacceptable amplifier power consumption.

Therefore, it would be desirable to design an amplifier with low quiescent current and low shoot-through current.

DETAILED DESCRIPTION

This application relates to integrated circuits with amplification circuitry. Integrated circuits may include amplification circuitry that may be used to amplify voltage signals (e.g., a push-pull amplifier in an I/O driver may be used to amplify a voltage signal for off-chip routing).

Figure 1:
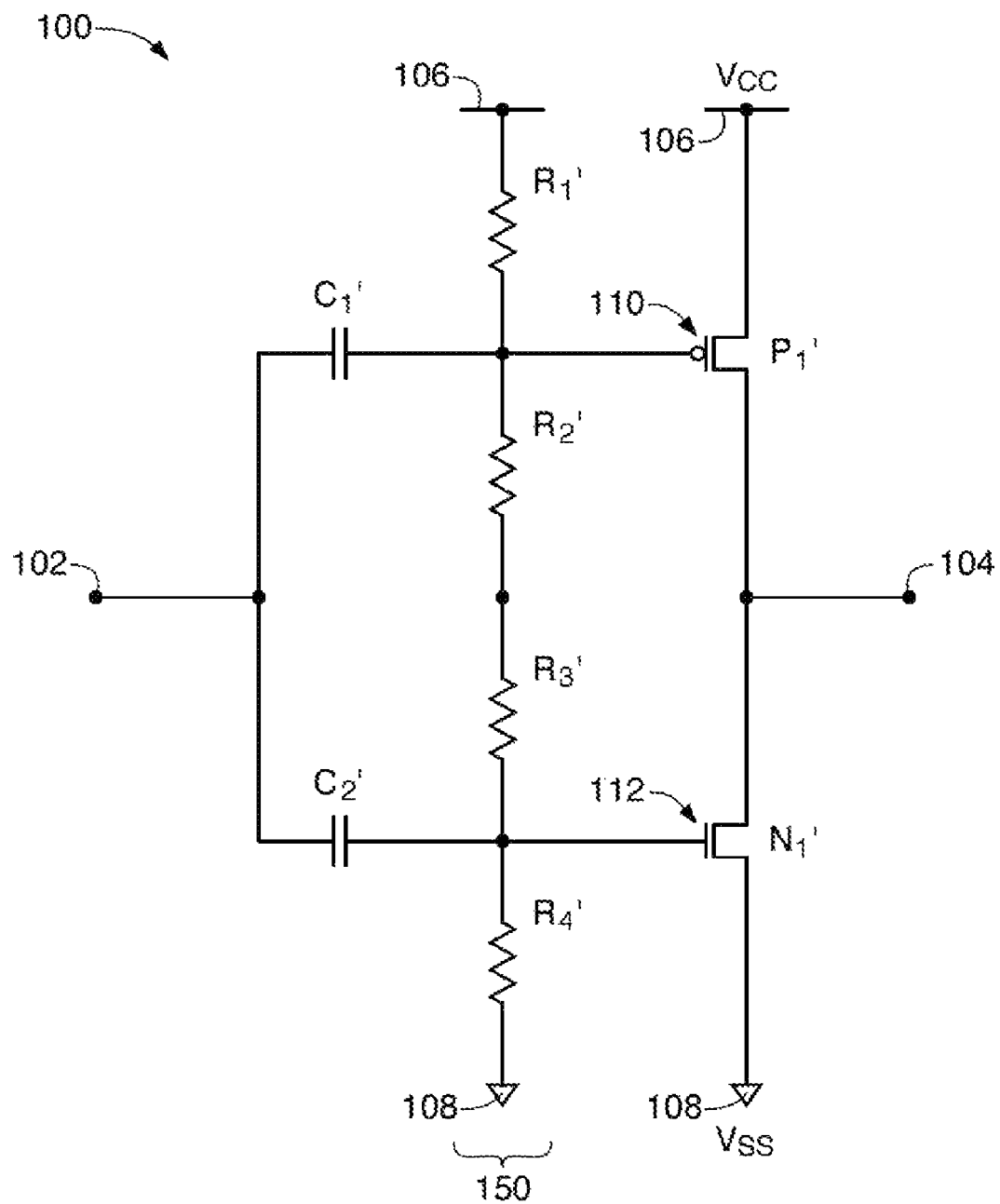
FIG. 1 is a schematic diagram of a conventional push-pull amplifier.

As shown in FIG. 1, conventional push-pull amplifier 100 is a four terminal device, where input terminal 102 is connected to an input line, output terminal 104 is connected to an output line, power supply terminal 106 is biased at positive power supply voltage Vcc, and ground terminal 108 is biased at power supply ground voltage Vss. The amplification for push-pull amplifier 100 is provided by PMOS transistor P1' and NMOS transistor N1'.

PMOS transistor P1' is connected in series with NMOS transistor N1' between power supply terminal 106 and power supply ground 108 (e.g., the source terminal of transistor P1' is connected to power supply terminal 106, the drain terminal of transistor P1' is connected to the drain terminal of transistor N1', and the source terminal of transistor N1' is connected to power supply ground 108).

Resistor R1' is connected between power supply terminal 106 and gate 110 of PMOS P1'. Resistors R2' and R3' are connected in series between gate 110 of PMOS transistor P1' and gate 112 of NMOS transistor N1'. Resistor R4' is connected between gate 112 of NMOS N1' and ground terminal 108. Resistors R1', R2', R3', and R4' form a resistive chain 150 from power supply terminal 106 to ground terminal 108. Resistive chain 150 forms a voltage divider that provides bias voltages to PMOS transistor gate 110 and NMOS transistor gate 112. Conventional push-pull amplifier 100 does not provide any protection against PVT variations such as supply voltage variation or transistor threshold voltage variation (e.g., an increase in the supply voltage Vcc of a conventional push-pull amplifier will increase the conventional push-pull amplifier's quiescent current and shoot-through current).

Figure 2:
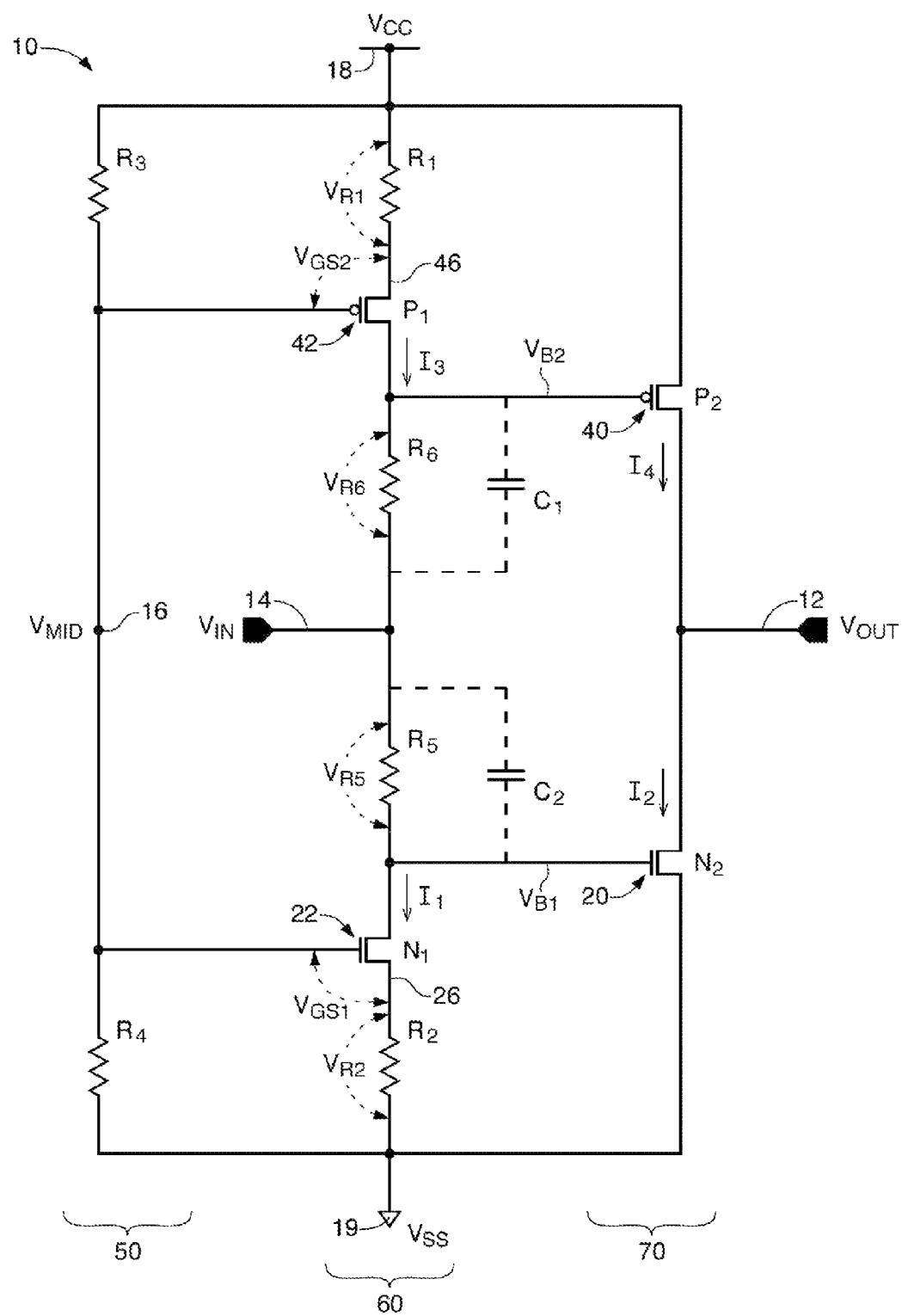
FIG. 2 is a schematic diagram of an illustrative push-pull amplifier and biasing circuitry for the amplifier in accordance with an embodiment of the present invention.

FIG. 2 is a schematic diagram of an illustrative push-pull amplifier 10. As shown in FIG. 2, push-pull amplifier 10 may be a four terminal device, with input terminal 14, output terminal 12, power supply voltage terminal 18, and ground terminal 19. Power supply voltage terminal 18 may be biased with a positive power supply voltage Vcc. Ground terminal 19 may be biased at a power supply ground voltage Vss. An input voltage signal Vin may be applied to input terminal 14. Push-pull amplifier 10 may be configured to have a gain. Push-pull amplifier 10 may drive the output terminal 12 with an output voltage Vout approximately equal to the input voltage signal Vin multiplied by the configured gain.

Resistor R3 and resistor R4 may form a resistive chain between power supply terminal 18 and ground terminal 19 (e.g., resistor R3 and resistor R4 may be coupled in series between power supply terminal 18 and ground terminal 19). Intermediate node 16 (e.g. the node at which resistor R3 and resistor R4 are coupled together) may have a voltage level dependent on the ratio between the resistance of resistors R3 and R4. For example, if resistor R3 and resistor R4 have the same resistance value, then the voltage at intermediate node 16 may be approximately equal to half of the voltage difference between power supply terminal 18 and ground terminal 19 (e.g., half of positive power supply voltage Vcc). The voltage at intermediate node 16 may be referred to herein as Vmid.

Resistors R1, R2, R5, and R6, PMOS transistor P1, and NMOS transistor N1 may form a resistive chain 60 that applies a bias voltage VB1 to gate 20 of NMOS transistor N2 and a bias voltage VB2 to gate 40 of PMOS transistor P2. Resistor R2, resistor R5, and NMOS transistor N1 may form a first half of resistive chain 60 that may apply a bias voltage VB1 to gate 20 of NMOS transistor N2. Resistor R1, resistor R6, and PMOS transistor P1 may form a second half of resistive chain 60 that may apply a bias voltage VB2 to gate 40 of PMOS transistor P2.

In the first half of resistive chain 60, NMOS transistor N1 may provide a current I1 through the first half of resistive chain 60. Intermediate node 16 may be coupled to gate 22 of NMOS transistor N1. Voltage Vmid may be applied to gate 22 of NMOS transistor N1 through the coupling of intermediate node 16 to gate 22. Application of bias voltage Vmid may generate a current I1 through transistor N1. Source node 26 of transistor N1 may be coupled to resistor R2. Transistor N1 may act as a source-follower transistor developing a voltage across resistor R2 approximately equal to the voltage level of gate 22 (e.g., bias voltage Vmid) minus the gate-source voltage Vgs1 of transistor N1 (e.g., VR2 may be approximately equal to Vmid minus Vgs1).

Current I1 generated by transistor N1 may flow through resistor R2 and resistor R5. Current I1 may cause a voltage drop VR5 across resistor R5. Resistor R5 may be chosen to have approximately the same resistance as resistor R2. In this configuration, the voltage drop VR5 across resistor R5 may be approximately equal to the voltage drop VR2 across resistor R2 (e.g., VR5 may be approximately equal to VR2, which may be approximately equal to Vmid minus Vgs1).

Gate 20 of transistor N2 may be coupled to the drain terminal of transistor N1. The voltage level at gate 20 may be approximately equal to the voltage level at input terminal 14 minus the voltage drop VR5 across resistor R5 (e.g., Vin minus VR5 may be approximately equal to Vin minus Vmid plus Vgs1).

As shown in the example of FIG. 2, input terminal 14 may be coupled to resistor R5. When the input voltage at input terminal 14 has a direct-current (DC) voltage approximately equal to Vmid, the DC voltage level at gate 20 may be approximately equal to voltage Vgs1 (e.g., the voltage level at gate 20 may be approximately equal to Vmid minus Vmid plus Vgs1). The source of N2 may be coupled to ground supply terminal 19. In this configuration, the voltage drop from gate terminal 20 of transistor N2 to the source terminal of transistor N2 may be approximately equal to the gate-source drop Vgs1 of transistor N1. Current I2 into the drain terminal of transistor N2 may then be approximately equal to the current I1 into the drain terminal of transistor N1.

Resistor R2 and resistor R5 may have resistances of approximately 8 kΩ, as an example. In general, resistors R2 and R5 may have any suitable resistances. Providing resistor R2 and resistor R5 with large resistances may decrease quiescent current through NMOS transistors N1 and N2 (e.g., the large resistances from resistor R2 and resistor R5 may decrease gate-source voltage Vgs1 and gate voltage 20 of transistor N2, which may decrease the quiescent current through transistors N1 and N2).

In the second half of circuit network 60, transistor P1 may be configured to provide a current I3 through the second half of resistive chain 60. Intermediate node 16 may be coupled to gate 42 of PMOS transistor P1. Voltage Vmid may therefore be applied to gate 42 of PMOS transistor P1 through the coupling of intermediate node 16 to gate 42. Bias voltage Vmid may generate a current I3 through transistor P1. Source node 46 of transistor P1 may be coupled to resistor R1. Transistor P1 may act as a source-follower transistor that develops a voltage across resistor R1 approximately equal to the voltage level of supply terminal 18 (e.g. Vcc) minus the voltage level of gate 42 (e.g., bias voltage Vmid) and the absolute value of gate-source voltage Vgs2 of transistor P1 (e.g., Vcc minus Vmid and |Vgs2|).

Current I3 generated by transistor P1 may flow through resistor R1 and resistor R6. Current I3 may cause a voltage drop VR6 across resistor R6. Resistor R6 may be chosen to have the same resistance as resistor R1. In this configuration, the voltage drop VR6 across resistor R6 may be approximately equal to the voltage drop VR1 across resistor R1 (e.g., VR6 may be approximately equal to VR1, which may be approximately equal to Vcc minus Vmid and |Vgs2|).

Gate 40 of transistor P2 may be coupled to the drain terminal of transistor P1. The voltage level at gate 40 may be approximately equal to the voltage level at input terminal 14 (e.g., Vin) plus the voltage drop across resistor R6 (e.g., Vin+VR6 may be approximately equal to Vin plus Vcc minus Vmid and |Vgs2|).

As shown in the example of FIG. 2, input terminal 14 may be coupled to resistor R6. When input voltage Vin has a DC value approximately equal to Vmid, the voltage level at gate 40 may be approximately equal to Vcc minus Vgs2 (e.g., the voltage level at gate 40 may be approximately equal to Vmid plus Vcc minus Vmid and |Vgs2|, which may be approximately equal to Vcc minus |Vgs2|). The source of transistor P2 may be coupled to power supply terminal 19. In this configuration, the voltage difference between gate terminal 20 of transistor P2 to the source terminal of transistor P2 may be approximately equal to the gate-source voltage difference Vgs2 of transistor P1. Current I4 from the drain terminal of transistor P2 may then be approximately equal to the current I3 from the drain terminal of transistor P1.

Resistor R1 and resistor R6 may have resistances of approximately 8 kΩ, as an example. In general, resistors R1 and R6 may have any suitable resistance. Providing resistor R1 and resistor R6 with large resistances may decrease quiescent current through PMOS transistors P1 and P2 (e.g., the large resistances from resistor R1 and resistor R6 may decrease the absolute value of gate-source voltage Vgs2 and thereby increase the gate voltage 40 of transistor P2, which may decrease the quiescent current through transistors P1 and P2).

Integrated circuits may experience variations in supply voltage due to PVT variations. In conventional push-pull designs, variations in supply voltages may cause unacceptable increases in output quiescent current. In the example shown in FIG. 2, resistive chain 60 may provide a biasing scheme that accommodates changes in supply voltage without significant changes in quiescent current. For example, if supply voltage Vcc increases due to PVT variations, the total voltage drop across resistive chain 60 increases. However, the change in total voltage drop across resistive chain 60 is tracked by PMOS transistor P1 and NMOS transistor N1, which may increase the current I3 from the drain of P1 and the current I1 into the drain of N1 (e.g., the increase in supply voltage leads to an increase of gate-source voltage Vgs1 of NMOS transistor N1 and an increase of gate-source voltage Vgs2 of PMOS transistor P1, which may increase current I3 and current I1). PMOS transistor P1 and NMOS transistor N1 may absorb the effects of supply voltage variation while maintaining the bias voltage VB2 at gate 40 of PMOS transistor P2 and the bias voltage VB1 at gate 20 of NMOS transistor N2 constant.

An input voltage signal Vin may be applied to input terminal 14. The first half of resistive chain 60 and the second half of resistive chain 60 may be coupled together at input terminal 14. In this configuration, current I1 provided by NMOS transistor N1 may be approximately equal to current I3 provided by PMOS transistor P1. Because NMOS transistor N1 forces current I1 to be constant and PMOS transistor P1 forces current I3 to be constant, current through resistor R5 and resistor R6 may be constant. The constant current through resistor R5 and resistor R6 creates a constant voltage drop across resistor R5 and a constant voltage drop across resistor R6. Small voltage changes in voltage signal Vin may then be conveyed to gate 40 of PMOS transistor P2 through resistor R6 and gate 20 of NMOS transistor N2 through resistor R5 (e.g., a small voltage change in input voltage Vin may result in a small voltage change at gate 40 of PMOS transistor P2 and in a small voltage change at gate 20 of NMOS transistor N2).

PMOS transistor P2 may be coupled in series with NMOS transistor N2 between power supply terminal 18 and ground terminal 19 (e.g., the source terminal of transistor P2 may be coupled to power supply terminal 18, the drain terminal of transistor P2 may be coupled to the drain terminal of transistor N2, and the source terminal of transistor N2 may be coupled to ground terminal 19). PMOS transistor P2 may supply current to output terminal 12 when voltage signal Vin is less than Vmid (e.g., when Vin is less than Vmid, the voltage at gate 40 may decrease below bias voltage VB2 and PMOS transistor P2 may supply current to output terminal 12). When PMOS transistor P2 is supplying current, NMOS transistor N2 may be shut off (e.g., when Vin is less than Vmid, the voltage at gate 20 may decrease below bias voltage VB1 and NMOS transistor N2 may conduct only negligible amounts of current). NMOS transistor N2 may sink current from output terminal 12 when voltage signal Vin is greater than Vmid (e.g., when Vin is greater than Vmid, the voltage at gate 20 may increase above bias voltage VB1 and NMOS transistor N2 may sink current from output terminal 12). When NMOS transistor N2 is sinking current, PMOS transistor P2 may be shut off (e.g., when Vin is greater than Vmid, the voltage at gate 40 may increase above bias voltage VB2 and PMOS transistor P2 may conduct only negligible amounts of current). The sinking of current by NMOS transistor N2 and supplying of current by PMOS transistor P2 may be referred to as push-pull amplification.

Push-pull amplifier 10 may be used to amplify high-bandwidth input signals (e.g., signals that include a relatively large range of frequencies). As shown in FIG. 2, optional capacitor C1 may be coupled between input terminal 14 and gate 40 of PMOS transistor P2 and optional capacitor C2 may be coupled between input terminal 14 and gate 20 of NMOS transistor N2. Capacitor C1 may allow high frequency input signals to couple directly to gate 40. Capacitor C2 may allow high frequency input signals to couple directly to gate 20. Capacitors C1 and C2 may be chosen to have capacitances suitable for high frequency signal coupling (e.g., 80 fF or any other suitable capacitances). By allowing high frequency coupling between input terminal 14 and gates 20 and 40, capacitors C1 and C2 may reduce the input delay of push-pull amplifier 10 (e.g., capacitors C1 and C2 may increase the response of push-pull amplifier 10 to high frequency signals).

Figure 3:
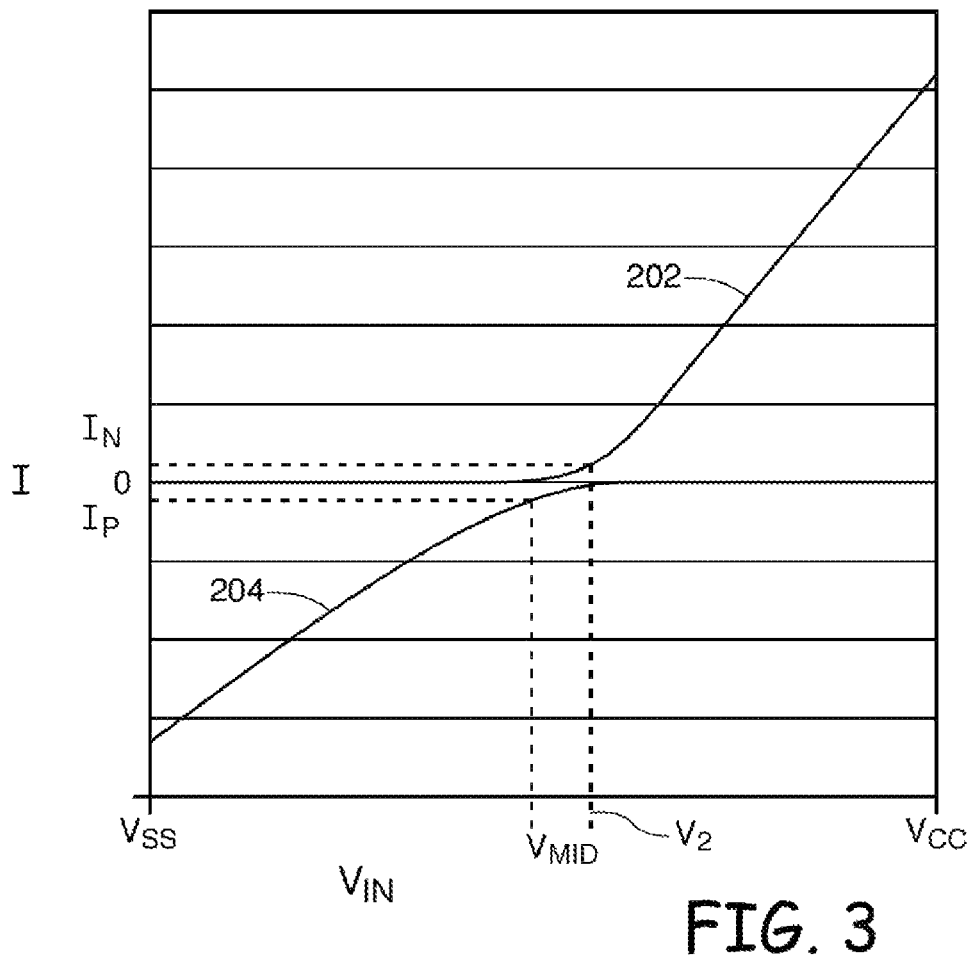
FIG. 3 is a graph illustrating the relationship between output current and input voltage of an illustrative push-pull amplifier of the type shown in FIG. 2 in accordance with an embodiment of the present invention

FIG. 3 shows the relationship between current flowing through output terminal 12 and the voltage level at input terminal 14. The current supplied by NMOS transistor N2 is represented by line 202, and the current drained by PMOS transistor P2 is represented by line 204. As shown in FIG. 3, at voltages above Vmid and below supply voltage Vcc, PMOS transistor P2 may supply a negligible amount of current and NMOS transistor N2 may drain (sink) current with a quadratic dependency on input voltage level (e.g., if the input voltage increases by a certain amount, the amount of output current drained by NMOS transistor N2 may increase with a value proportional to the square of the increase in input voltage). At input voltage levels below Vmid, NMOS transistor N2 may drain a negligible amount of current and PMOS transistor P2 may supply current with a quadratic dependency on the input voltage level (e.g., if the input voltage decreases by a certain amount, the amount of output current supplied by PMOS transistor P2 may increase with a value proportional to the square of the decrease in input voltage).

As shown in FIG. 3, at input voltage levels close to Vmid, both NMOS transistor N2 and PMOS transistor P2 may conduct current (e.g., at an input voltage of voltage V2, NMOS transistor N2 may be sinking current In while PMOS transistor P2 may be sourcing current Ip). The resulting direct current from supply terminal 18 to ground terminal 19 at input voltage levels when both transistor N2 and transistor P2 are conducting may be referred to as shoot-through current. The shoot-through current may be dependent on the quiescent current (e.g., a low quiescent current may result in a low shoot-through current). The low quiescent current of amplifier 10 may result in a low shoot-through current for amplifier 10.

Figure 4:
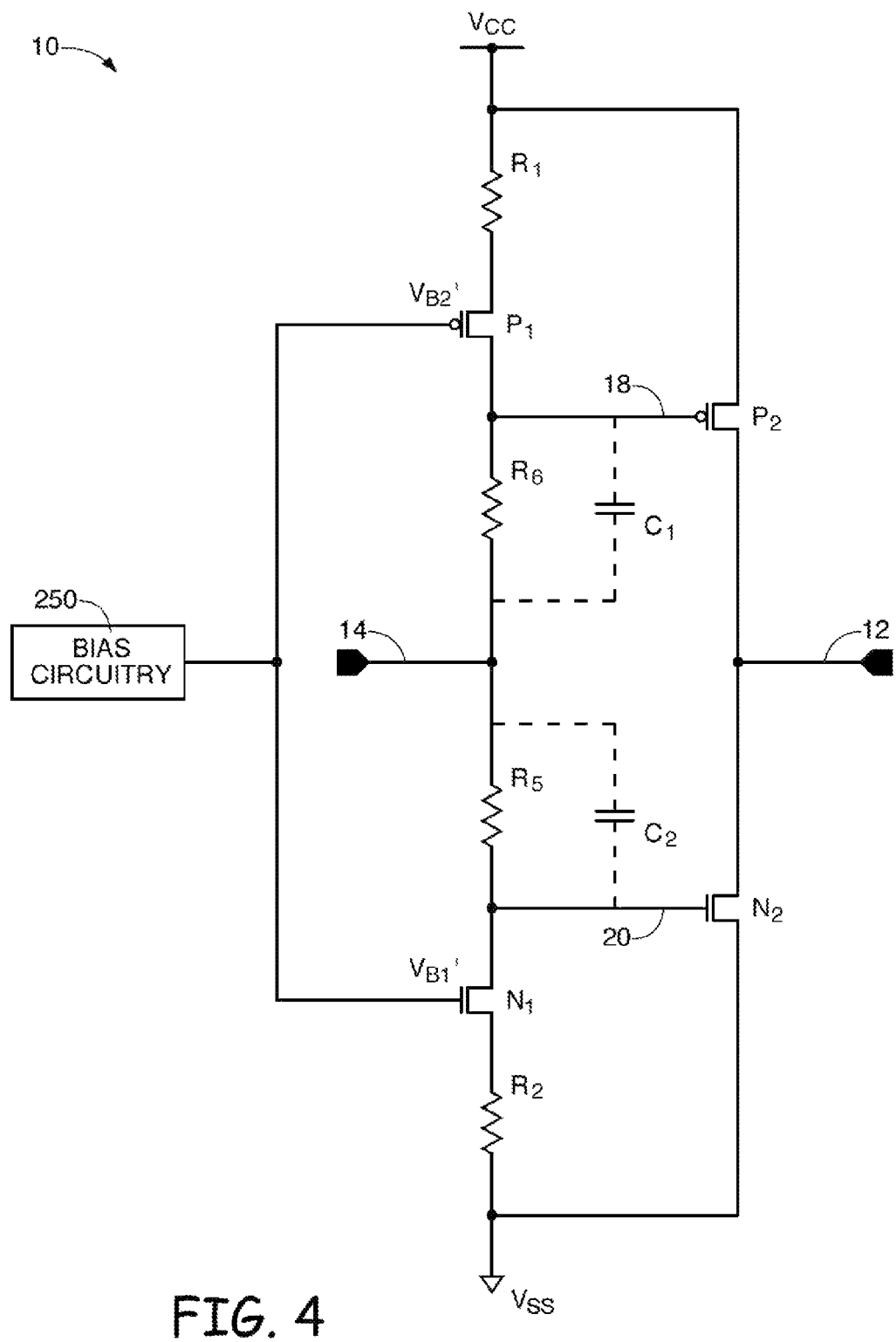
FIG. 4 is a schematic diagram of an illustrative push-pull amplifier and biasing circuitry for the amplifier in accordance with an embodiment of the present invention.

FIG. 4 shows a possible alternate configuration. In the example of FIG. 4, bias circuitry 250 supplies a bias voltage VB1' to NMOS transistor N1 and a bias voltage VB2' to PMOS transistor P1. Bias voltages VB1' and VB2' may be chosen to accommodate supply voltage variation, resistor value variations, or other PVT variations (as an example). Bias circuitry 250 may be a resistive voltage divider, capacitive voltage divider, or any other circuitry suitable for supplying bias voltages VB1' and VB2'. If desired, voltage VB1' may be approximately equal to voltage VB2'.

While each the source-drain terminals of the various transistors described herein may be referred to herein as either a source terminal or a drain terminal, in general, the source and drain terminals may be swapped (e.g., terminals described herein as being source terminals may, if desired, be drain terminals and terminals described herein as being drain terminals may, if desired, be source terminals).

While voltage Vss has been described here as a ground voltage (e.g., a signal at zero volts), voltage Vss may have a non-zero voltage, if desired. As an example, voltage Vss may be negative and equal in magnitude to Vcc (e.g., Vss may be approximately equal to -Vcc). In this example, voltage Vmid may be approximately equal to a ground voltage (e.g., a signal at zero volts). In other suitable arrangements, voltage Vss may be any suitable negative or positive voltage.

Various embodiments have been described illustrating circuitry for biasing amplifiers. Integrated circuits may include amplification circuitry. The amplification circuitry may be used to amplify voltage signals (e.g., to amplify voltage signals to drive the signals to other areas on the same integrated circuit or to another integrated circuit). The amplification circuitry may be formed with push-pull amplifiers.

Each push-pull amplifier may have a power supply voltage terminal, a ground voltage terminal, an input terminal, and an output terminal. The power supply terminal may be biased to a positive power supply voltage. The ground terminal may be biased to a ground power supply voltage. Each push-pull amplifier may have first, second, and third stages. Each stage may have respective input terminals and output terminals.

The first stage may have an output terminal coupled to input terminals of the second stage. The first stage may provide biasing for the second stage. Current flowing through the second stage may be dependent on the biasing provided by the first stage.

The second stage may have first, second, and third nodes. The first node may be coupled to the amplifier input terminal. The second node may be coupled to a first input terminal of the third stage, and may provide biasing for the third stage. The third node may be coupled to a second input terminal of the third stage, and may provide biasing for the third stage. Current through the third stage may be dependent on the biasing provided by the second node and the third node of the second stage. The second stage may prevent variations in supply voltage from affecting the biasing of the third stage.

The input voltage signal may be conveyed from the amplifier input terminal to the first input terminal of the third stage through the second node of the second stage. The input voltage signal may further be conveyed from the amplifier input terminal to the second input terminal of the third stage through the third node of the second stage.

The third stage may have a node coupled to the amplifier output terminal. The third stage may provide amplification of the amplifier input signal (conveyed to the third stage from the amplifier input terminal through the second stage). As an example, the third stage may provide push-pull amplification.

The foregoing is merely illustrative of the principles of this invention which can be practiced in other embodiments.

What is claimed is:

1. Amplifier circuitry, comprising:
   first and second transistors that each have a gate terminal and that are coupled together in series between a positive power supply terminal at a first voltage and a ground terminal at a second voltage;
   bias circuitry that applies a third voltage to the gate terminals of the first and second transistors, wherein the third voltage is approximately midway between the first and second voltage;
   an input terminal that is coupled between the first and second transistors, wherein the input terminal is electrically isolated from the bias circuitry;
   a first resistor that is coupled in series between the positive power supply terminal and a first source-drain region of the first transistor;
   a second resistor that is coupled in series between a first source-drain region of the second transistor and the ground terminal;
   a third resistor that is coupled between a second source-drain region of the first transistor and the input terminal;
   a fourth resistor that is coupled between the input terminal and a second source-drain region of the second transistor, wherein the first transistor comprises a PMOS transistor, wherein the second transistor comprises a NMOS transistor;
   an output terminal;
   a third transistor coupled between the positive power supply terminal and the output terminal
   a fourth transistor coupled between the output terminal and the ground terminal, wherein the second source-drain region of the first transistor is coupled to a gate of the third transistor, wherein the second source-drain region of the second transistor is coupled to a gate of the fourth transistor;
   a first capacitor coupled between the input terminal and the gate of the third transistor; and
   a second capacitor coupled between the input terminal and the gate of the fourth transistor.

2. Amplifier circuitry, comprising:
   an input terminal;
   first and second transistors each having a gate terminal, wherein the first and second transistor are coupled together in series between a positive power supply terminal and a ground terminal and wherein the input terminal is coupled to a first node between the first and second transistors; and
   first and second resistors coupled together in series between the positive power supply terminal and the ground terminal, wherein the gate terminals of the first and second transistors are directly connected to a second node between the first and second resistors.

3. The amplifier circuitry defined in claim 2, further comprising:
   an amplification stage;
   a third node coupled between a source-drain terminal of the first transistor and the first node, wherein the third node provides biasing for the amplification stage; and
   a fourth node coupled between a source-drain terminal of the second transistor and the first node, wherein the fourth node provides biasing for the amplification stage.

4. The amplifier circuitry defined in claim 3, wherein an input signal received through the input terminal is conveyed to the amplification stage through the third and fourth nodes.

5. Amplifier circuitry, comprising:
   an input terminal;
   first and second transistors; and
   first and second resistors coupled together in series between the first and second transistors, wherein the input terminal is coupled to a node between the first and second resistors; and
   bias circuitry that is coupled to a gate of the first transistor and a gate of the second transistor, wherein the bias circuitry reduces variations in current through the first and second transistors, wherein the bias circuitry comprises a capacitive divider.

6. The amplifier circuitry defined in claim 5, wherein the bias circuitry comprises a resistive divider.

* * * * *